United States Patent
Sajed

(10) Patent No.: US 9,570,694 B2
(45) Date of Patent: Feb. 14, 2017

(54) ALL PRINTED AND TRANSPARENT CNT TFT

(71) Applicant: ANEEVE LLC, Torrance, CA (US)

(72) Inventor: Farzam Sajed, Mission Viejo, CA (US)

(73) Assignee: Aneeve LLC, Torrance, CA (US)

(*) Notice: Subject to any disclaimer, the term of this patent is extended or adjusted under 35 U.S.C. 154(b) by 0 days.

(21) Appl. No.: 14/763,791

(22) PCT Filed: Jan. 27, 2014

(86) PCT No.: PCT/US2014/013238
§ 371 (c)(1),
(2) Date: Jul. 27, 2015

(87) PCT Pub. No.: WO2014/117104
PCT Pub. Date: Jul. 31, 2014

(65) Prior Publication Data
US 2015/0364707 A1    Dec. 17, 2015

Related U.S. Application Data

(60) Provisional application No. 61/757,637, filed on Jan. 28, 2013.

(51) Int. Cl.
*H01L 51/05* (2006.01)
*H01L 51/00* (2006.01)
*H01L 51/10* (2006.01)
*H01L 21/00* (2006.01)

(52) U.S. Cl.
CPC ....... *H01L 51/0541* (2013.01); *H01L 51/0005* (2013.01); *H01L 51/0022* (2013.01); *H01L 51/0516* (2013.01); *H01L 51/105* (2013.01); *H01L 51/0048* (2013.01)

(58) Field of Classification Search
None
See application file for complete search history.

(56) References Cited

U.S. PATENT DOCUMENTS

| | | |
|---|---|---|
| 7,999,020 B2 | 8/2011 | Frisbie et al. |
| 8,049,292 B2 | 11/2011 | Takahashi et al. |
| 8,053,291 B2 | 11/2011 | Liu et al. |

(Continued)

OTHER PUBLICATIONS

"Design Guidelines for Metallic-Carbon-Nanotube-Tolerant Digital Logic Circuits" by Zhang et al. Aug. 2008.*

(Continued)

*Primary Examiner* — Evren Seven

(57) ABSTRACT

A transparent thin film transistor is fabricated on a substrate by first depositing a concentrated aqueous metallic carbon nanotube solution using an inkjet printer on the substrate to form source and drain electrodes with a channel therebetween. The deposited metallic carbon nanotubes are then cleaned in mild acid; and the source and drain electrodes are cured by heating. An aqueous semiconducting carbon nanotube solution is then deposited in the channel on the substrate using an inkjet printer on the substrate to form a channel semiconductor. The channel semiconductor is then cleaned using a mild acid. A dielectric gate of ionic gel dielectric is then deposited on the cleaned channel semiconductor using an inkjet printer; and the ionic gel dielectric is cured by heating.

7 Claims, 4 Drawing Sheets

(56) References Cited

U.S. PATENT DOCUMENTS

| 8,202,760 | B2 | 6/2012 | Hirakata et al. |
| 2010/0261321 | A1 | 10/2010 | Hirano et al. |
| 2011/0147715 | A1 | 6/2011 | Rodgers et al. |

OTHER PUBLICATIONS

"Predicted Performance Advantages of Carbon Nanotube Transistors with Doped Nanotubes as Source/Drain" by Guo et al. Dec. 2003.*

"Fabrication of carbon nanotube field-effect transistors with semiconductors as source and drain contact materials" by Xiao et al. Dec. 2009.*

International Search Report dated May 14, 2014—PCT/US2014/013238—Jan. 27, 2014.

Choi, S et al, "Short-Channel Transistors Constructed with Solution-Processed Carbon Nanotubes", ACS Nano, vol. 7, No. 1, Dec. 21, 2012, pp. 798-803, ponline], [retriefed on Apr. 21, 2014], retrieved from the internet—URL: http://nano.eecs.berley.edu/publications/ACSNano_2013_shortCNTFETs.pdf; p. 799.

* cited by examiner

ALL PRINTED AND TRANSPARENT CNT TFT

This application claims priority to Provisional Application 61/757,637, filed Jan. 28, 2013, the disclosure of which is incorporated herein by reference.

BACKGROUND

The field of the present invention is the manufacture of thin film transistors (TFTs).

Transparent electronics has attracted broad attention because of many of its promising commercial impacts since it can be used in many different applications such as solar cells, transparent displays and photodetectors. Ideal transparent electronics and displays are required to have high optical transparency, good electrical performance such as low power consumption and capability with diverse low cost substrates.

Table 1 undertakes a comparative study of various material systems used to implement TFTs. Metal oxides, amorphous silicon (a-Si) and low temperature polysilicon (LTPS) are possible candidates for transparent thin film transistors but high fabrication temperature and expensive vacuum and cleanroom facilities are required. Organic TFTs are also promising as they facilitate solution processing pathways; however, poor electrical performance such as high $V_{TH}$ and low mobility has hampered their progress. Single crystals polymers are emerging as desirable candidates, with solution processing capabilities and improved electrical performance. By comparing TFTs constructed on low temperature polysilicon, organic material, metal oxides and amorphous silicon with CNT TFTs, it is clear that the carbon based systems are the only candidates that offer transparency, flexibility, scalability, low temperature of fabrication and high mobility. Carbon based material such as CNT make it possible to conceive of a solution processing capability that offers dramatic cost benefits beyond existing vacuum-based TFT manufacturing methods.

SUMMARY

The present invention is directed to the construction and fabrication of single-walled all carbon nanotube thin film transistors (CNT TFT). Conventional printing techniques are used to fabricate thin film transistors by printing in series metallic CNT for the source and drain electrodes, semiconducting CNT as the channel material and ionic gel as the dielectric material. This process may be employed for room temperature fabrication without requiring cleanroom or vacuum equipment and facilities. Such printing processes as inkjet and roll-to-roll methods could be employed. The fabricated CNT TFTs have been found to exhibit electrical performance with an on/off ratio of 92 and mobility of 2.27 $cm^2V^{-1}s^{-1}$ and transmissivity of 82%. The combination of both high electrical performance and high transparency make all-CNT TFTs desirable for next generation transparent display backplanes and products.

TABLE 1

A comparison of the current TFT landscape

|  | LTPS | a-Si | Metal Oxide | Organics | CNT |
|---|---|---|---|---|---|
| Materials | Polysilicon | Amorphous Si | ZnO based | pentacene | Carbon Nanotubes |
| Mobility | 10-100 $cm^2$/VS | 0.5 $cm^2$/VS | 1-15 $cm^2$/VS | 0.1-10 $cm^2$/VS | 30-100 $cm^2$/VS |
| Uniformity | Poor | Excellent | Good | Good | Good |
| Stability | Excellent | Poor | Poor | Low | Excellent |
| Scalable | Limited to <40" | Excellent, >100" | Potential to 100" | Excellent, >100" | Excellent, >100" |
| Process temp | High: >400° C. | 200-300° C. | 200° C.-350° C. | <150° C. | <150° C. |
| Cost | High | Low | Medium | Low | Low |
| Transparent | YES | YES | YES | YES | YES |
| Flexibile | No | No | No | YES | YES |
| Challenges | Cost High Temps | Low Device performance | Threshold voltage unstable; manufacturing process not mature | Stability | Need scalability proof of concept |

DETAILED DESCRIPTION OF THE PREFERRED EMBODIMENT

In order to improve the performance of printed flexible electronics, there is a need for printable high capacitance dielectrics that can serve as insulators for the gates of TFTs. High capacitance insulators in the gates result in both lower TFT operating voltage and high current. This is ideal and desirable for flexible transparent circuits that are required to have low power consumption for mobile application. In recent publications, there has been reports of ionic gel gated CNT TFTs that are p-type in air and ambipolar in vacuum. Very stable ambipolar CNT TFTs were obtained with high yield under vacuum by using ionic liquid composite gels (PS-PMMA-PS/EMIM-TFSI). In electronic devices Ionic gels are attracting interest because of their unique properties such as super-capacitance $$\left(10\frac{\mu F}{cm^2}\right)$$

and carrier accumulation $$\left(>10^{14}\frac{1}{cm}\right).$$

It is shown that their capacitance is to be independent of the thickness of the ionic gel and Arrhenius-type temperature dependent in their impedance spectroscopy investigations. Given the desirable attributes of ionic gels, we have adopted PS-PMMA-PS material to act as a hybrid dielectric and gate within our CNT TFT device topology. The material has a high capacitance $$\left(10\frac{\mu F}{cm^2}\right),$$

desirable viscosity for printing, transparency and thermal stability.

The process for creating CNT TFTs using ionic gels includes using an inkjet printer at room temperature. These transistors can be printed on glass, plastic and silicon substrate and all exhibit similar electrical performance. Electrical performance of p-type transistor characteristics include on/off ratio of 92, mobility equal to 2.27 cm$^2$V$^{-1}$s$^{-1}$ and threshold voltage of 2V with optical transmissivity of 82% and thermal stability (<200° C.). The optical transmissivity is such that the results of this process are considered for purposes here to be transparent; and "transparent" is used herein to describe results of this order of transparency.

Experimental Detail

Figure 1:
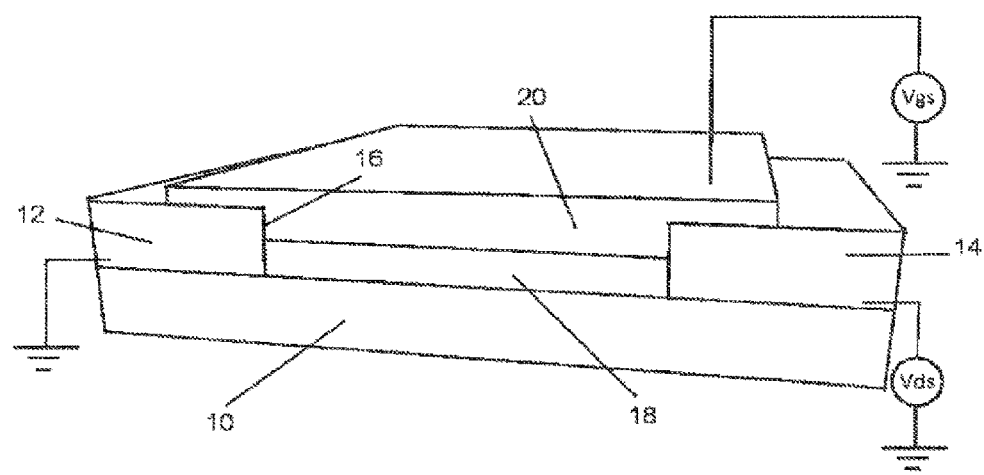
FIG. 1 is a schematic diagram of transparent all-CNT TFT on glass substrate.

The fabricated device of FIG. 1 includes a substrate 10, a source electrode 12, a drain electrode 14, a channel 16 between the source and drain electrodes 12, 14, a channel semiconductor 18 and a dielectric 20. The CNT TFT fabrication process resulting in the device of FIG. 1 began with glass microscope slides successively cleaned with acetone and ethanol and soft baked at a temperature of 100° C. for 15 minutes. The slides were then printed on with CNT ink. A Sonoplot GIX Microplotter II was used. Metallic CNT electrodes were inkjet printed from concentrated metallic CNT solution (1 mg in 10 mL aqueous solution, Nanointegris) using a 30 μm tip. The printed electrodes defined a channel having a length of 200 μm and a width of 1300 μm. The printed metallic electrodes were left in air for 24 hours and then washed by soaking the substrate inside a mild acid for 24 hours. A curing step followed at 250° C. and another layer of metallic CNT was printed over the previous layer to increase CNT density of which the final sheet resistance obtained was 6 KΩ/$\sqrt[3]{}$. A semiconducting carbon nanotube solution (1 mg in 100 mL aqueous solution, Nanointegris) was directly inkjet printed with a 30 μm tip between the metallic electrodes to fill the transistor channel. Clean semiconducting carbon nanotube films were obtained by soaking the printed substrate inside a mild acid for 24 hours. Ionic gel, a solution of PS-PMMA-PS (1.5%, weight) and EMIM TFSI (8.5%, weight) in ethyl acetate, was prepared. Since ionic gel has a high viscosity, it was printed using a 500 μm in diameter tip in order to print a uniform and transparent layer of gel over the channel of the TFTs. The resulting devices were cured at a temperature of 105° C. for 1 hour. After the cure, the all-CNT devices are considered fabricated.

Following fabrication, a scanning electron microscope (SEM) image was prepared using a FIB Nova 600. The electrical characterizations of the TFTs were recorded using a Keithley 4200 semiconductor characterization system and a micromanipulator probe station in a clean and shielded box at room temperature. Transmissivity measurements were taken using a Varian Cary 50 UV-Vis Spectrophotometer.

Reflection

Figure 2:
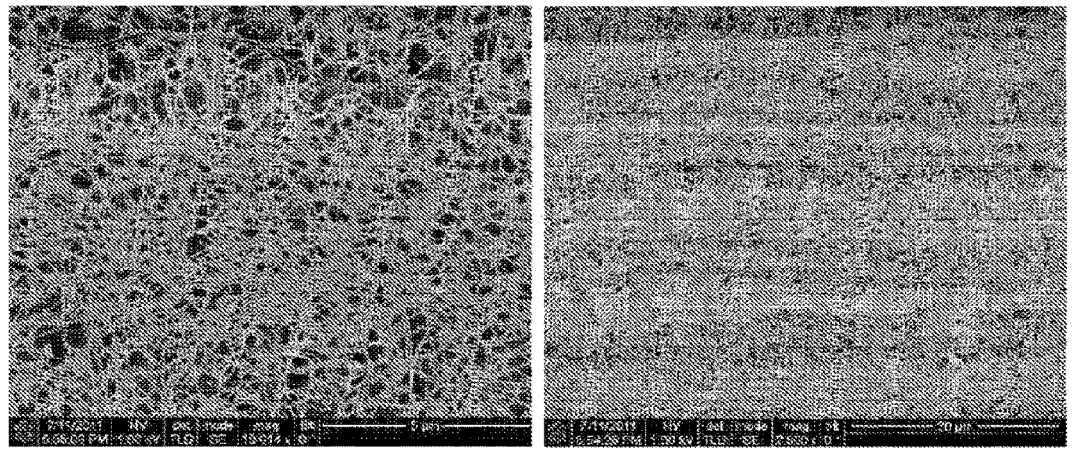
FIG. 2 is a top-view SEM image of printed semiconducting CNT in the channel of the TFTs.

The all-CNT TFTs fabricated as above are comprised of clean and uniform CNT material as shown via SEM topographic analysis in FIG. 2. Due to the raster printing profile, non-uniform CNT density can be observed (right). These scan lines are perpendicular to the source and drain electrodes. As a result, the average CNT density of $$\Lambda_o^{-1} = 30\frac{tubes}{\mu m^2}$$

is observed within the channel of a TFT.

Figure 3:
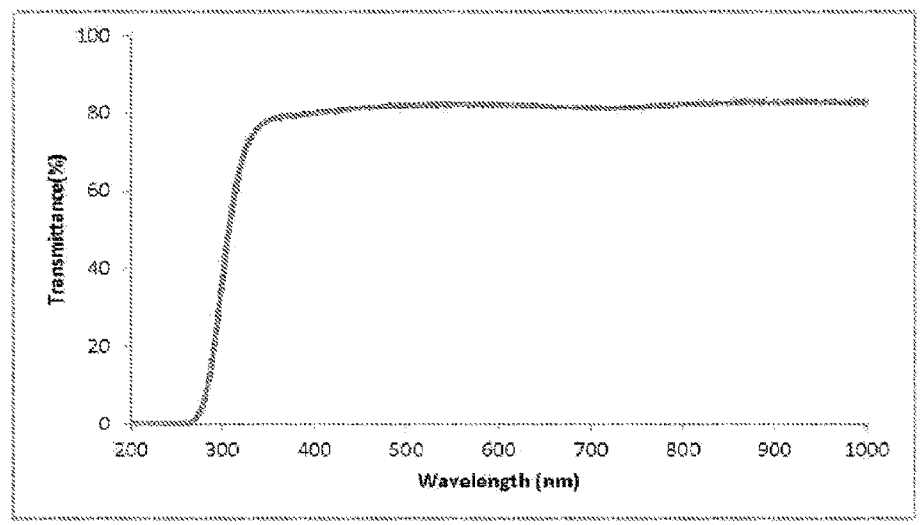
FIG. 3 is an optical transmission spectra of entire all-CNT TFT arrays on glass substrate.
Figure 4A:
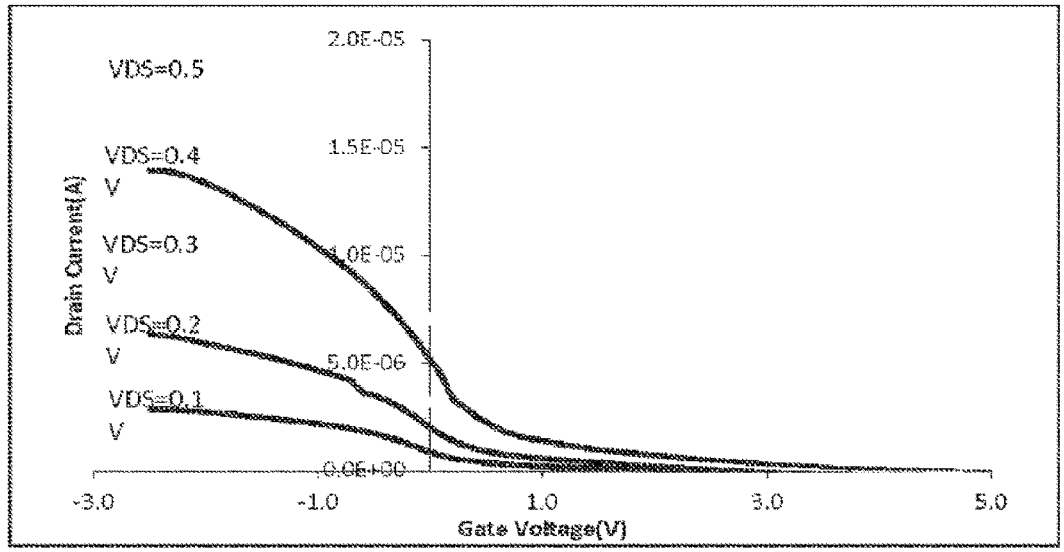
FIG. 4A is drain current verses gate voltage for an all-CNT transparent TFT on glass substrate with W/L=1300 μm/200 μm; $V_{ds}$=0.1 V to 0.5 V in 0.1 V increments from bottom to top.
Figure 4B:
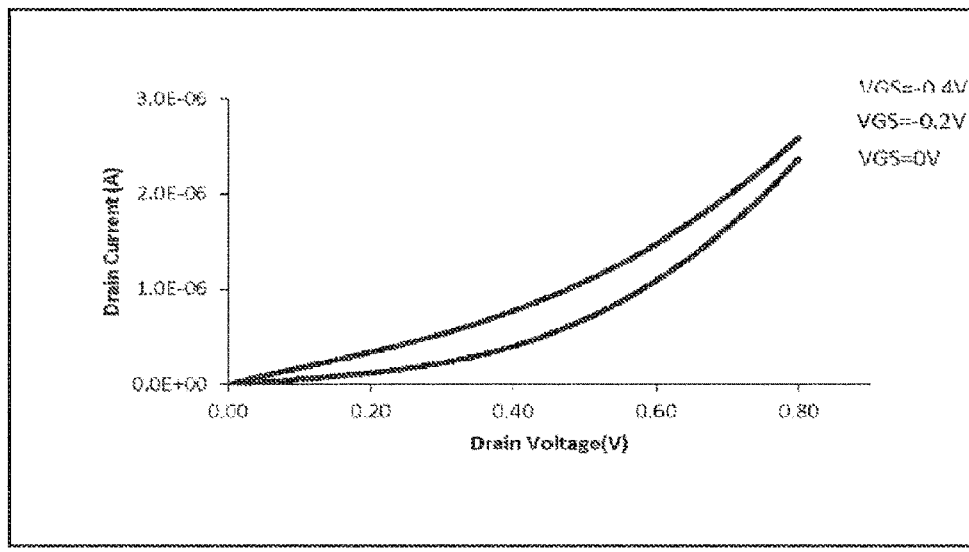
FIG. 4B is drain current verses drain voltage for an all-CNT transparent TFT on glass substrate with W/L=1300 μm/200 μm; $V_{gs}$=-0.4 V to 0 V in 0.2 V increments from top to bottom.
Figure 4C:
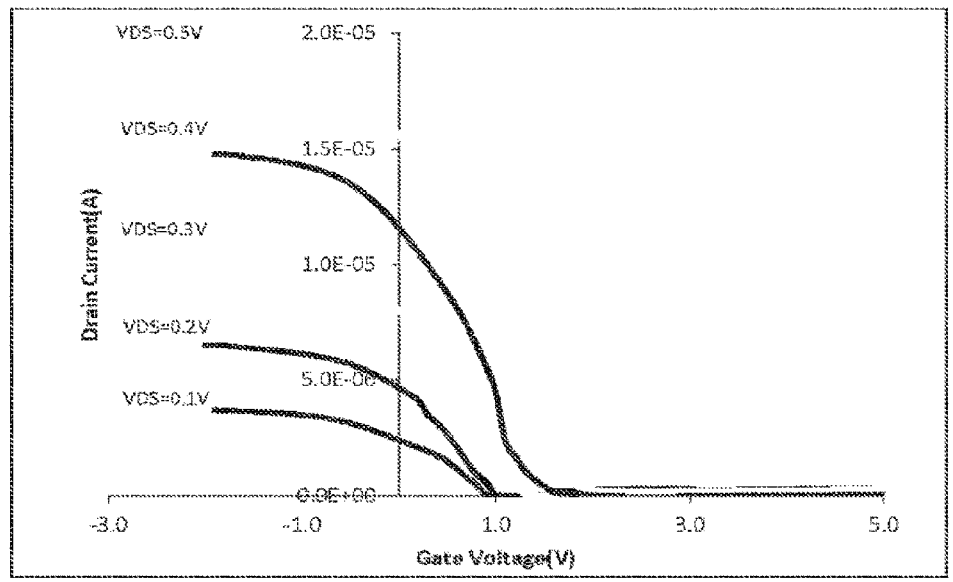
FIG. 4C is drain current verses gate voltage for an all-CNT TFT on silicon substrate with W/L=1300 μm/200 μm; $V_{ds}$=0.1 V to 0.5 V in 0.1 V increments from bottom to top.
Figure 4D:
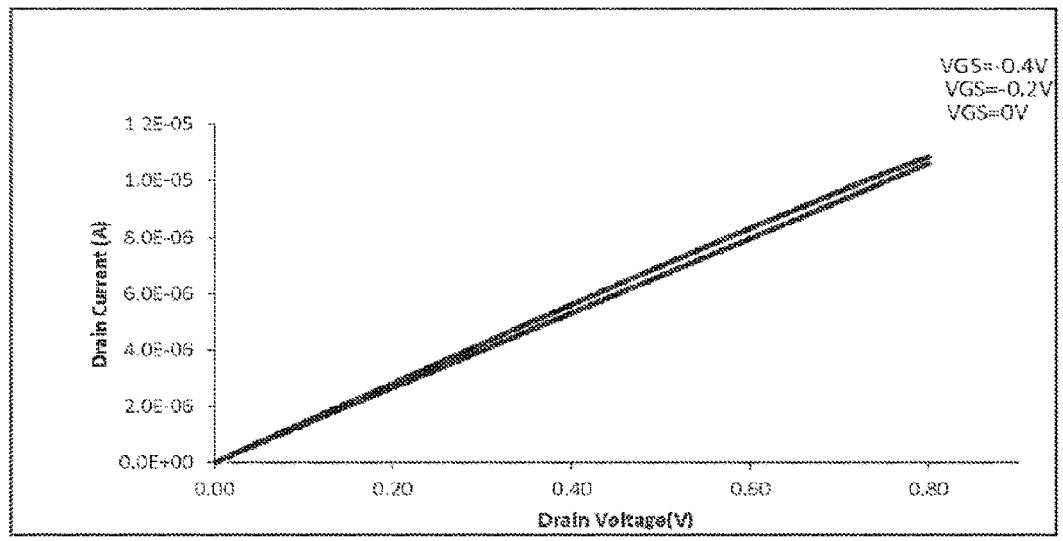
FIG. 4D is drain current verses drain voltage for an all-CNT TFT on silicon substrate with W/L=1300 μm/200 μm; $V_{gs}$=-0.4 V to 0 V in 0.2 V increments from top to bottom.

FIG. 3 shows the optical transmission spectra of the CNT TFTs fabricated on a glass substrate. All-CNT devices fabricated on glass substrate show an optical transmittance of greater than 82%, highlighting the desirable transparency to visible light. The characteristic I-V curves of the gate voltage and drain voltage sweeping of the TFT printed on glass substrate are shown in FIG. 4a and FIG. 4b. I-V curves of the gate voltage and drain voltage sweeping of the TFT printed on silicon substrate are shown in FIG. 4c and FIG. 4d. These devices exhibit typical p-type transistor properties. CNT TFTs that were printed on glass substrate have an on/off ratio of 92, a threshold voltage of 2V and an effective device mobility of 2.27 cm$^2$V$^{-1}$s$^{-1}$. CNT TFTs that were printed on silicon substrate have an on/off ratio of 100, a threshold voltage of 1.5V and an effective device mobility of 3.636 cm$^2$V$^{-1}$s$^{-1}$. Mobility was calculated using the standard mobility equation of $$\mu = \frac{L_C}{W_C V_{DS} C}\frac{\partial I_D}{\partial V_{GS}}$$

where C is the gate capacitance at $V_{DS}$=0.5V. C of the dielectric can be calculated using the parallel plate model $$C = \frac{\varepsilon}{t_{ox}} = 6.90 \times 10^{-9}\frac{F}{cm^2} \text{ where } \varepsilon = \varepsilon_0\varepsilon_{ox} = 3.45 \times 10^{-13}\frac{F}{cm}$$

is the dielectric constant and $t_{ox}$=500 nm is the thickness of the dielectric layer. However, in the case of carbon nanotube transistors, this model overestimates the gate capacitance when the density of the carbon nanotubes are low. Because of the one dimensional property of nanotubes, electrostatic coupling between nanotubes needs to be considered when calculating the gate capacitance which will require a more rigorous model. Hence we undertook the following approach where C can be calculated by:

$$C = \left\{ C_Q^{-1} + \frac{1}{2\Pi\varepsilon\varepsilon_o} \ln\left[ \frac{\Lambda_o}{R} \frac{\sinh(2\Pi t_{ox}/\Lambda_o)}{\Pi} \right] \right\}^{-1} \Lambda_o^{-1}.$$

Where $$C_Q = 4 \times 10^{-12} \frac{F}{cm}$$

is the quantum capacitance of the CNTs;

$$\Lambda_o^{-1} = 30 \frac{\text{tubes}}{\mu m^2}$$

is the linear density of the CNTs; and R=1.5 nm is the average density of the nanotubes. This gives $$C = 6.77 \times 10^{-7} \frac{F}{cm^2}$$

which is similar to the capacitance value based on the parallel-plate model.

The On/Off ratios for these devices are low due to the process of acid treatment on semiconducting CNTs within the channel of TFTs. Soaking the printed semiconductor CNT inside the acid solution will reduce the sheet resistance of the semiconducting film within the channel by removal of SDS among the cross-junctions and enhancement of metallicity of the film. The metallicity of the nanotubes can connect the source and drain directly to each other, resulting in drastic increase in the off-current of these TFTs thus reducing the on/off ratio.

CONCLUSION

In conclusion, fully inkjet printed SWCNT TFTs were fabricated in high yield and reproducibility by printing high concentrated metallic CNT ink as source and drain electrodes, semiconducting CNT as channel material and ionic gel as gate dielectric. Transistors that were printed on glass substrate have an on/off ratio of 92, threshold voltage of 2V and an effective device mobility of 2.27 $cm^2V^{-1}s^{-1}$. The combination of low voltage operation and transparency in visible wavelengths and room temperature fabrication demonstrates that all-CNT transparent TFTs are promising for developing the next generation transparent displays.

Thus a process for making all-CNT transistors has been presented. While embodiments and applications of this invention have been shown and described, it would be apparent to those skilled in the art that many more modifications are possible without departing from the inventive concepts herein. The invention, therefore, is not to be restricted except in the spirit of the appended claims.

The invention claimed is:

1. A method of fabricating a transparent thin film transistor, comprising:
   printing a concentrated aqueous metallic carbon nanotube solution on a substrate to form separated metallic carbon nanotube source and drain electrode layers on the substrate, the metallic carbon nanotube source and drain electrode layers defining a channel space there between;
   cleaning the metallic carbon nanotube source and drain electrode layers by soaking in a mild acid to form cleaned metallic carbon nanotube source and drain electrode layers;
   curing the cleaned metallic carbon nanotube source and drain electrode layers by heating to form cured metallic carbon nanotube source and drain electrode layers; and then
   printing an aqueous semiconducting carbon nanotube solution in the channel space on the substrate to form a carbon nanotube channel semiconductor layer;
   cleaning the carbon nanotube channel semiconductor layer by soaking in another mild acid to form a cleaned carbon nanotube channel semiconductor layer;
   printing an ionic gel dielectric on the cleaned carbon nanotube channel semiconductor layer at room temperature to form an ionic gel dielectric layer thereon; and then
   curing the ionic gel dielectric layer by heating.

2. The method of claim 1, wherein the printing of the concentrated aqueous metallic carbon nanotube solution is by inkjet printing, printing of the aqueous semiconducting carbon nanotube solution by inkjet printing and the printing of the of the ionic gel dielectric is by inkjet printing.

3. The method of claim 1, wherein the curing of the cleaned metallic carbon nanotube source and drain electrode layers is at 250° C.

4. The method of claim 1, wherein the curing of the ionic gel dielectric layer is at 105° C.

5. The method of claim 1, further including increasing the carbon nanotube density of the metallic carbon nanotube source and drain electrode layers by a second printing of the concentrated aqueous metallic carbon nanotube solution on the cured metallic carbon nanotube source and drain electrode layers.

6. The method of claim 1, the aqueous semiconducting carbon nanotube solution being at a ratio of 1 mg in 100 mL.

7. The method of claim 1, wherein, the metallic carbon nanotube source and drain electrode layers are air dried before the soaking in mild acid.

* * * * *